United States Patent [19]
Sakurai

[11] Patent Number: 5,970,021
[45] Date of Patent: Oct. 19, 1999

[54] SYNCHRONOUS SEMICONDUCTOR MEMORY DEVICE HAVING FUNCTION OF INHIBITING OUTPUT OF INVALID DATA

[75] Inventor: Mikio Sakurai, Hyogo, Japan

[73] Assignee: Mitsubishi Denki Kabushiki Kaisha, Tokyo, Japan

[21] Appl. No.: 09/058,858

[22] Filed: Apr. 13, 1998

[30]   Foreign Application Priority Data

Nov. 14, 1997 [JP]   Japan .................................. 9-313738

[51] Int. Cl.$^6$ ...................................................... G11C 8/00
[52] U.S. Cl. ...................... 365/233; 365/230.03; 365/195
[58] Field of Search .............................. 365/233, 230.03, 365/195, 230.08, 189.05

[56]   References Cited

U.S. PATENT DOCUMENTS 5,777,942   7/1998   Dosaka et al. ..................... 365/230.03

FOREIGN PATENT DOCUMENTS 7-85663   3/1995   Japan .

Primary Examiner—Huan Hoang
Attorney, Agent, or Firm—McDermott, Will & Emery

[57]   ABSTRACT

A reset signal generation circuit included in an output control circuit ANDs a reset signal for resetting complementary data buses for transferring data to a second output stage at prescribed timing and an internal control signal corresponding to a read mask signal and outputs a reset signal for resetting other complementary data buses for transferring the data to a final output stage. Thus, invalid data is reset on the complementary data buses.

14 Claims, 14 Drawing Sheets

SYNCHRONOUS SEMICONDUCTOR MEMORY DEVICE HAVING FUNCTION OF INHIBITING OUTPUT OF INVALID DATA

BACKGROUND OF THE INVENTION

1. Field of the Invention

The present invention relates to a semiconductor memory device, and more particularly, it relates to a synchronous semiconductor memory device performing an operation in response to an external clock signal.

2. Description of the Prior Art

A synchronous semiconductor memory device developed for high-speed access executes every operation (instruction) necessary for reading or writing data in synchronization with a clock (external clock signal) supplied from the exterior in a stable cycle.

The structure of a principal part of a conventional synchronous semiconductor memory device 9000 is now described with reference to FIG. 11.

The conventional synchronous semiconductor memory device 9000 shown in FIG. 11 comprises a plurality of banks (FIG. 11 representatively shows a bank B0), an output stage 10 and an output control circuit 20.

The synchronous semiconductor memory device 9000 further comprises an internal clock generation circuit (not shown) for generating an internal clock signal synchronous with an external clock signal, for reading data from the bank B0 in synchronization with the internal clock signal when a read instruction is inputted from the exterior. The output stage 10 outputs the data read from the bank B0 to a data input/output terminal DQ on the basis of a signal outputted from the output control circuit 20. A read mask signal (referred to as EXTDQM) inputted from the exterior in such a read operation is adapted to mask (inhibit) output of the data at prescribed timing.

The structure of the output stage 10 is now described. The output stage 10 comprises a first output stage C1, a second output stage C2 and a final output stage C3.

The first output stage C1 includes a preamplifier 11 and a gate circuit 12. Complementary data buses RDA and ZRDA connect the preamplifier 11 and the gate circuit 12 with each other. The preamplifier 11 amplifies the data read from the bank B0. The gate circuit 12 outputs the data received from the preamplifier 11 to complementary data buses RDF and ZRDF in response to a gate control signal ZBEST(0).

When four banks are provided, data read from the remaining banks (not shown) are transferred to the complementary data buses RDF and ZRDF in response to gate control signals ZBEST(1), ZBEST(2) and ZBEST(3) outputted from the output control circuit 20 respectively. In other words, the data outputted from any bank are selectively transferred to the complementary data buses RDF and ZRDF in response to any of the gate control signals ZBEST(0), ZBEST(1), ZBEST(2) and ZBEST(3).

The second output stage C2 comprises a gate circuit 13 and a latch circuit 14. The gate circuit 13 fetches the data from the complementary data buses RDF and ZRDF in response to a gate control signal RDGATE. The latch circuit 14 latches the data received from the gate circuit 13 and outputs the same to complementary data buses RD and ZRD.

The final output stage C3 comprises a gate circuit 15 and an output buffer 16. The gate circuit 15 latches the data from the complementary data buses RD and ZRD in response to a gate control signal CLKOEN. The output buffer 16 amplifies the data received from the gate circuit 15 and outputs the same to the data input/output terminal DQ.

The complementary data buses RDF and ZRDF are connected with a P-channel MOS transistor P1. The transistor P1 resets the complementary data buses RDF and ZRDF in response to a reset control signal ZRDFPC.

The complementary data buses RD and ZRDF are connected with a P-channel MOS transistor P2. The transistor P2 resets the complementary data buses RD and ZRD in response to a reset control signal ZRDPC.

The output control circuit 20 is now described.

The output control signal 20 generates various signals for controlling the flow of the data in the output stage 10. FIG. 11 representatively illustrates a reset signal generation circuit 21, a gate control signal generation circuit 22, a reset signal generation circuit 23, a gate control signal generation circuit 24 and an output control signal generation circuit 25.

The reset signal generation circuit 21 outputs the reset signal ZRDFPC for controlling the ON/OFF state of the transistor P1. The gate control signal generation circuit 22 outputs the gate control signal RDGATE for controlling switching of the gate circuit 13. The reset signal generation circuit 23 outputs the reset signal ZRDPC for controlling the ON/OFF state of the transistor P2. The gate control signal generation circuit 24 outputs the gate control signal CLKOEN for controlling switching of the gate circuit 15. The output control signal generation circuit 25 outputs an output enable signal OEM for controlling the operation of the output buffer 16.

The circuit structures of the output control signal generation circuit 25 and the final output stage C3 are now described with reference to FIG. 12.

The final output stage C3 is first described. As shown in FIG. 12, the gate circuit 15 includes NAND circuits N3, N4, N5 and N6 and an invertor circuit I2. The NAND circuit N4 is connected with the complementary data buses RD and ZRD. The NAND circuit N3 receives the gate control signal CLKOEN and a power supply voltage VDD. The invertor circuit I2 inverts and outputs an output of the NAND circuit N3. The NAND circuit N5 is connected with the data bus RD and output nodes of the NAND circuit N4 and the invertor circuit I2. The NAND circuit N6 is connected with the data bus ZRD and the output nodes of the NAND circuit N4 and the invertor circuit I2. The gate circuit 15 transfers the data received from the complementary data buses RD and ZRD to the output buffer 16 in response to the gate control signal CLKOEN.

The output buffer 16 is formed by a driver 17 and a latch circuit 18. The latch circuit 18 includes an invertor circuit I1, NAND circuits N1 and N2, AND circuits A1 and A2 and NOR circuits NR1 and NR2. The latch circuit 18 latches the signal outputted from the gate circuit 15 and outputs the same to complementary data buses DQ0 and ZDQ0. The output enable signal OEM outputted from the output control signal generation circuit 25 controls the operation of the latch circuit 18.

The driver 17 is connected with the complementary data buses DQ0 and ZDQ0. The driver 17 receives the data from the complementary data buses DQ0 and ZDQ0, for amplifying and outputting the result to the data input/output terminal DQ.

The output control signal generation circuit 25 is now briefly described. As shown in FIG. 12, the output control signal generation circuit 25 includes shift circuits 30 and 31, a NAND circuit N19 and an invertor circuit I4.

The shift circuit 31 shifts a signal OEMF by a time responsive to a CAS latency CL and outputs the same (signal OEMST). The CAS latency LC is a value indicating the number of the clock for starting outputting the data after input of a read instruction READ. The signal OEMF, which keeps a high level by a burst length BL (value indicating the number of clocks of read data to be outputted), is generated on the basis of the read instruction READ.

The shift circuit 30 includes NAND circuits N11, N12, N13, N14, N15, N16, N17 and N18. The shift circuit 30 outputs an internal control signal ZDQM in a delay by one clock with respect to an internal clock signal CLK (and an inverted clock signal ZCLK. The internal control signal ZDQM is a negative-phase internal signal corresponding to the read mask signal EXTDQM.

The NAND circuit N19 receives the signal OEMST and the output signal from the shift circuit 30 in its input. The invertor circuit I4 receives an output signal from the NAND circuit N19 in its input, for inverting the same and outputting the result as the output enable signal OEM.

The synchronous semiconductor memory device 9000 successively outputs the data read from the banks to the exterior in a pipeline operation on the basis of the aforementioned reset signal ZRDFPC and ZRDPC, gate control signals ZBEST(0) to ZBEST(3), RDGATE and CLKOEN, and output enable signal OEM.

An operation of the conventional synchronous semiconductor memory device 9000 is now described with reference to a timing chart shown at (A) to (Q) in FIG. 13.

A read operation with reference to the bank B0 is described on the assumption that the CAS latency CL is 3 and the burst length BL is 4. It is assumed that the internal clock signal CLK rises at times t1, t2, t3 .... It is also assumed that the synchronous semiconductor memory device 9000 performs the read operation only with respect to the single bank B0 (thus, the gate control signal ZBEST(0) is regularly fixed at a low level). It is further assumed that the read mask signal EXTDQM is inputted at a time t5 (for masking data outputted at a time t7 if the latency is 2).

As shown in FIG. 13, an activation instruction ACT (for activating a word line) is inputted at the time t1 and the read instruction READ is inputted at the time t3, whereby a column selection signal CSL rises to a high level to activate a column system of the bank B0. Thus, first read data (read at the time t3) is transferred to the preamplifier 11, which in turn amplifies this data and transfers the result to the complementary data buses RDF and ZRDF.

Following a time t4, the gate control signal RDGATE goes high at a proper time. Therefore, the latch circuit 14 fetches the data from the complementary data buses RDF and ZRDF. Thus, the latch circuit 14 transfers the first read data from the complementary data buses RDF and ZRDF to the complementary data buses RD and ZRD.

Then, the reset signal ZRDFPC of a low level is generated at a proper time so that the transistor P1 receiving the same in its gate conducts, thereby precharging the complementary data buses RDF, ZRDF, RDA and ZRDA.

Then, a second column selection signal CSL rises to a high level for transferring second read data (read at the time t4) to the preamplifier 11. The preamplifier 11 amplifies the transferred second data and transfers the result to the complementary data buses RDF and ZRDF again.

Following the time t5, the gate control signal CLKOEN goes high at a proper time so that the output buffer 16 fetches the first read data transferred to the complementary data buses RD and ZRD at the time t4.

The data input/output terminal DQ outputs the data (Q0 at (C) in FIG. 13) fetched in the output buffer 16 to the exterior when the output enable signal OEM enters a high-level state.

Then, the reset signal ZRDPC of a low level is generated at a proper time so that the transistor P2 receiving this signal in its gate conducts, thereby precharging the complementary data buses RD and ZRD. Thus, next data can be transferred.

Then, the gate control signal RDGATE goes high at a proper time. Thus, the second read data is transferred from the complementary data buses RDF and ZRDF to the complementary data buses RD and ZRD.

Then, the reset signal ZRDFPC of a low level is generated at a proper time so that the transistor P1 receiving this signal in its gate enters a conducting state, thereby precharging the complementary data buses RDF, ZRDF, RDA and ZRDA.

Then, a third column selection signal CSL goes high for transferring third read data (read at the time t5) to the preamplifier 11. The preamplifier 11 amplifies and transfers the data to the complementary data buses RDF and ZRDF.

At a time t6, the gate control signal CLKOEN goes high, so that the output buffer 16 fetches the second read data transferred to the complementary data buses RD and ZRD.

However, the output enable signal OEM goes low due to the read mask signal EXTDQM inputted at the time t5. Therefore, the second read data, which is to be outputted from the data input/output terminal DQ to the exterior at the time t7, is not outputted.

The same operation is further repeated for outputting data Q0, Q2 and Q3 in correspondence to the first, third and fourth read data except the second read data.

If the CAS latency CL is 2, the complementary data buses RDA and ZRDA, RDF and ZRDF and RD and ZRD perform the same operations in a single cycle. In this case, these complementary data buses RDA and ZRDA, RDF and ZRDF and RD and ZRD are simultaneously precharged.

As hereinabove described, the conventional synchronous semiconductor memory device 9000 can output the data by operating at the timing shown at (A) to (Q) in FIG. 13 in synchronization with the external clock signal supplied from the exterior in a stable cycle.

However, the conventional synchronous semiconductor memory device 9000 disadvantageously outputs data to be masked to the exterior, as described below.

This problem of the conventional synchronous semiconductor memory device 9000 is now described with reference to a timing chart shown at (A) to (J) in FIG. 14.

It is assumed that data are read at times identical to those shown at (A) to (Q) in FIG. 13. The read mask signal EXTDQM is inputted at a time t5.

As shown in FIG. 14, the output enable signal OEM falls from a high level to a low level at a time t6, due to the read mask signal EXTDQM inputted at the time t5. At this fall timing, the output enable signal OEM cannot immediately fall to the low level with respect to the leading edge of the external clock signal EXTCLK, in order to satisfy a data hold tOH (generally 3 ns) of output data. Therefore, the output enable signal OEM must maintain the high level for a period of several ns from the leading edge (time t6) of the external clock signal EXTCLK.

On the other hand, the synchronous semiconductor memory device 9000 must perform the serial transfer operation (pipeline operation) for transferring the data from the complementary data buses RD and ZRD to the output buffer 16, then from the complementary data buses RDF and ZRDF to the complementary data buses RD and ZRD and from the bank B0 to the complementary data buses RDF and ZRDF in a single operation clock. In order to increase the data output speed (operating speed) of the conventional synchronous semiconductor memory device 9000, therefore, the gate control signal CLKOEN must rise as fast as possible so that the output buffer 16 fetches the data at a high speed.

When such requirement is satisfied, however, the output enable signal OEM maintains the high-level state on the trailing edge of the gate control signal CLKOEN (see the output enable signal OEM at the time t6 shown at (D) in FIG. 14). Thus, the output buffer 16 disadvantageously fetches the data to be masked despite the read mask instruction and outputs the same to the exterior (see an output DOUT at the time t6 shown at (J) in FIG. 14).

If the synchronous semiconductor memory device 9000 outputs this data (hereinafter referred to as invalid data), which must not be outputted from the first, to the exterior, a malfunction is disadvantageously caused in a system receiving the invalid data.

SUMMARY OF THE INVENTION

Accordingly, an object of the present invention is to provide a synchronous semiconductor memory device which can prevent output of invalid data when receiving a read mask instruction, for correctly operating at a high speed.

The synchronous semiconductor memory device according to the present invention comprises a plurality of banks each including a memory cell array including a plurality of memory cells arranged in rows and columns and a plurality of word lines provided in correspondence to the rows of the memory cell array, an internal clock generation circuit for outputting an internal clock signal synchronous with an external clock signal, a read circuit for reading data from a memory cell of a corresponding bank in synchronization with the internal clock signal in response to a read instruction inputted from the exterior, a data bus for transferring the data read by the read circuit, an output circuit for receiving the data transferred from the data bus and outputting a signal corresponding to the data to a data output terminal, a reset circuit for resetting the data bus, and an output control circuit for controlling the reset timing of the reset circuit. The output control circuit brings the data bus into a reset state in response to a mask signal for inhibiting external output of the data received from the read circuit at prescribed timing.

The principal advantage of the present invention resides in a point that it is possible to prevent external output of invalid data by resetting the data bus provided with the invalid data in response to the mask signal thereby guaranteeing a correct high-speed operation while ensuring a data hold period for output data.

According to another aspect of the present invention, a synchronous semiconductor memory device comprises a plurality of banks each including a memory cell array including a plurality of memory cells arranged in rows and columns and a plurality of word lines provided in correspondence to the rows of the memory cell array, an internal clock generation circuit for outputting an internal clock signal synchronous with an external clock signal, a read circuit for reading data from a memory cell of a corresponding bank in synchronization with the internal clock signal in response to a read instruction inputted from the exterior, a data bus for transferring the data read by the read circuit, an output circuit for receiving the data transferred from the data bus and outputting a signal corresponding to the data to a data output terminal, and an output control circuit for controlling the data transfer from the read circuit to the data bus. The output control circuit inhibits the data transfer from the read circuit to the data bus in response to a mask signal for inhibiting output of the data received from the read circuit to the exterior at prescribed timing.

Namely, another advantage of the present invention resides in a point that it is possible to prevent external output of invalid data by inhibiting the data transfer between the read circuit and the data bus in response to the mask signal, thereby guaranteeing a correct high-speed operation while ensuring a data hold period for the output data.

According to still another aspect of the present invention, a synchronous semiconductor memory device comprises a plurality of banks each including a memory cell array including a plurality of memory cells arranged in rows and columns and a plurality of word lines provided in correspondence to the rows of the memory cell array, an internal clock generation circuit for outputting an internal clock signal synchronous with an external clock signal, a read circuit for reading data from a memory cell of a corresponding bank in synchronization with the internal clock signal in response to a read instruction inputted from the exterior, a data bus for transferring the data read by the read circuit, and an output circuit for receiving the data transferred from the data bus and outputting a signal corresponding to the data to a data output terminal. The output control circuit inhibits the output circuit from fetching the data from the data bus in response to a mask signal for inhibiting external output of the data received from the read circuit at prescribed timing.

Namely, still another advantage of the present invention resides in a point that it is possible to prevent external output of invalid data by inhibiting the output circuit of a final stage from fetching the data in response to the mask signal thereby guaranteeing a correct high-speed operation while ensuring a data hold period for the output data.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
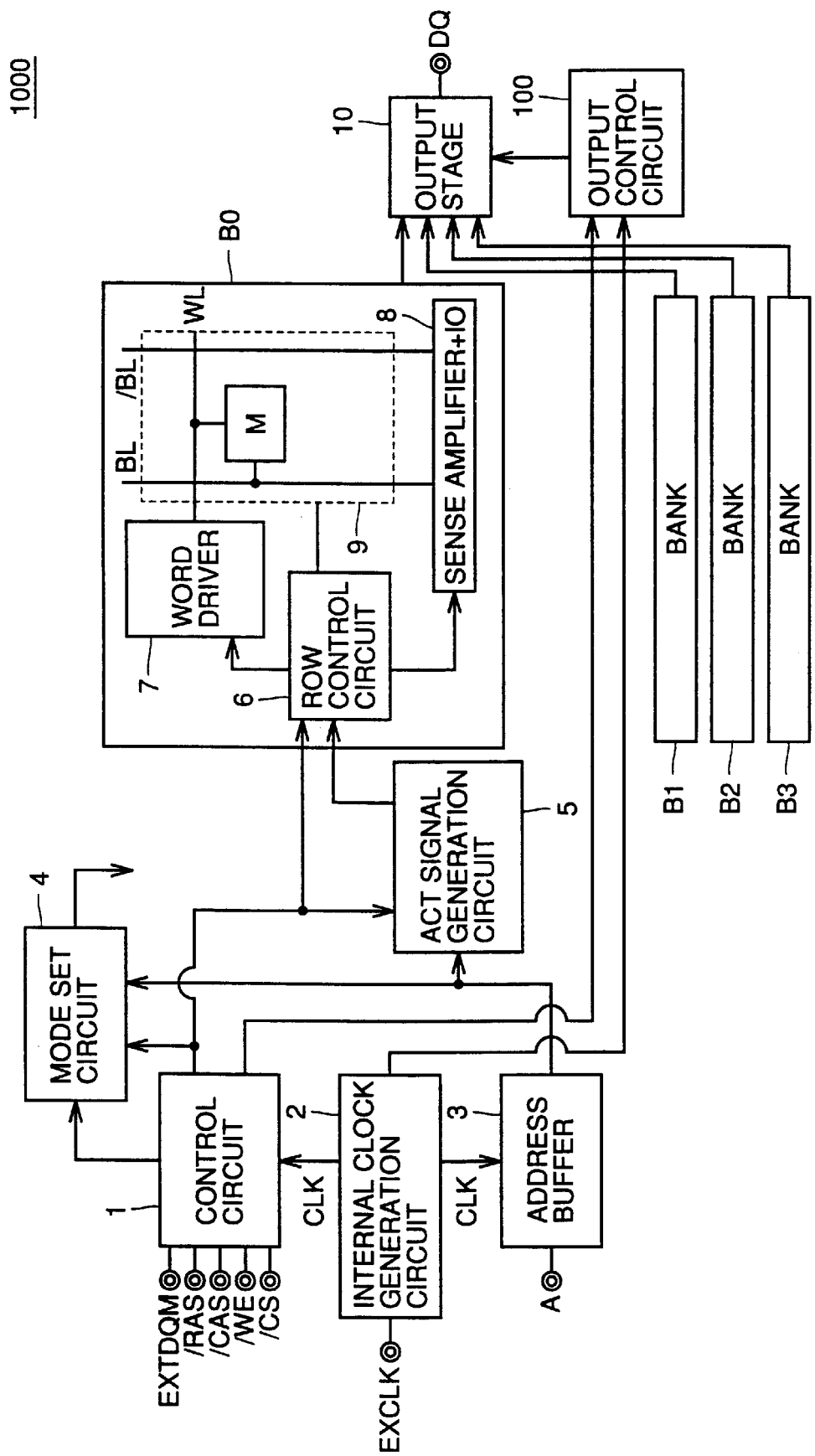
FIG. 1 is a schematic block diagram showing an exemplary structure of a principal part of a synchronous semiconductor memory device 1000 according to an embodiment of the present invention.

A synchronous semiconductor memory device 1000 according to an embodiment 1 of the present invention is now described. The synchronous semiconductor memory device 1000 according to the embodiment 1 of the present invention is adapted to enable prevention of external output of invalid data by controlling reset timing for data buses for transferring read data when receiving a read mask instruction.

The overall structure of the synchronous semiconductor memory device 1000 according to the embodiment 1 of the present invention is now described with reference to FIG. 1.

In the following description, elements identical to those of the conventional synchronous semiconductor memory device 9000 are denoted by the same reference numerals or symbols, for omitting redundant description.

The synchronous semiconductor memory device 1000 shown in FIG. 1 includes a control circuit 1, an internal clock generation circuit 2, an address buffer 3, a mode set circuit 4, an act signal generation circuit 5 and a plurality of banks (B0, B1, B2 and B3 in FIG. 1).

Each of the banks B0, B1, B2 and B3 includes a row control circuit 6, a word driver 7, a memory cell array 9, a sense amplifier, and an I/O gate. Referring to FIG. 1, numeral 8 denotes the sense amplifier and the I/O gate in a single block. Each of the banks B0, B1, B2 and B3 are capable of independently activating word lines, reading data, writing data and inactivating the word lines.

The memory cell array 9 includes a plurality of memory cells M arranged in rows and columns, and each memory cell M is connected to the intersection between a word line WL provided in correspondence to the row direction and a bit line pair BL and /BL provided in correspondence to the column direction.

The control circuit 1 receives external control signals (an external address strobe signal /RAS, a column address strobe signal /CAS, an external write enable signal /WE and the like) including a read mask signal EXTDQM, and outputs corresponding internal control signals (ZDQM, RAS, CAS, WE and the like).

The internal clock generation circuit 2 fetches an external clock signal EXTCLK, and outputs an internal clock signal CLK for controlling an internal operation.

The address buffer 3 fetches an address signal A received from the exterior, and outputs an internal address signal. A row address signal X and a column address signal Y are multiplexed on the address signal A in a time-sharing manner. The address buffer 3 comprises a bank address decoder (not shown), for decoding the address signal A and outputting a bank decode signal for specifying a corresponding bank.

The act signal generation circuit 5 outputs an act start signal for controlling the row control circuit 6 of the specified bank in response to an activation instruction inputted from the exterior.

When receiving the corresponding act start signal, each row control circuit 6 outputs a precharge signal for precharging the corresponding bit lines BL and /BL, a word driver activation signal for activating the word driver 7 and a sense amplifier activation signal for activating the sense amplifier in inactive, active and active states respectively.

Consequently, the bit lines BL and /BL forming the memory cell array 9 are released from precharged states and the word line WL rises to a high level. The sense amplifier amplifies data stored in the memory cell M.

When a read instruction READ is inputted from the exterior, the data latched in the sense amplifier is transferred to an output stage 10 described later through the I/O gate.

The mode set circuit 4, which is adapted to set a specific mode in response to an external signal, outputs a mode signal in response to the control circuit 1 and a signal received from the address buffer 3 (mode register set instruction). Thus, various modes such as a CAS latency CL and a burst length BL can be set.

The synchronous semiconductor memory device 1000 further includes the output stage 10 and an output control circuit 100.

When receiving the read mask instruction, the output control circuit 100 generates a reset signal for resetting invalid data on data buses at timing different from the general one. Thus, external output of the invalid data can be prevented even if an output enable signal OEM is at a high level and goes low in a delay.

An exemplary structure of the output control circuit 100 in the embodiment 1 of the present invention is now described with reference to FIG. 2.

Figure 2:
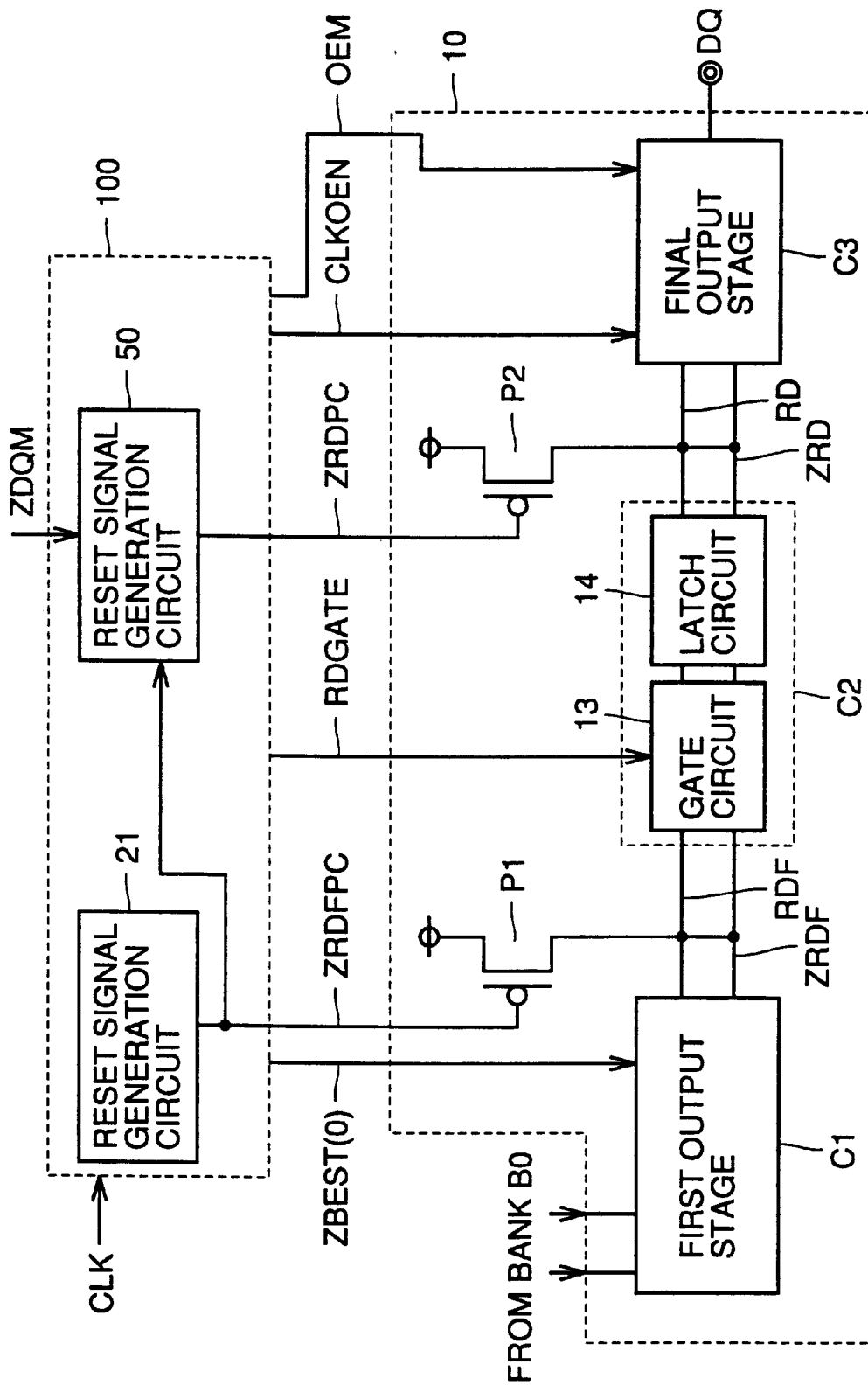
FIG. 2 is a circuit diagram showing an exemplary structure of a principal part of an output control circuit 100 in the embodiment 1 of the present invention.

The output control circuit 100 shown in FIG. 2 includes a reset signal generation circuit 50. The reset signal generation circuit 50 outputs a reset signal ZRDPC for controlling an ON/OFF state of a transistor P2 on the basis of the internal clock signal CLK, a reset signal ZRDFPC outputted from the reset signal generation circuit 21 and the internal control signal ZDQM. The remaining signals are generated at the same timing as those in the prior art.

An exemplary structure of the reset signal generation circuit 50 shown in FIG. 2 is now described with reference to FIG. 3.

Figure 3:
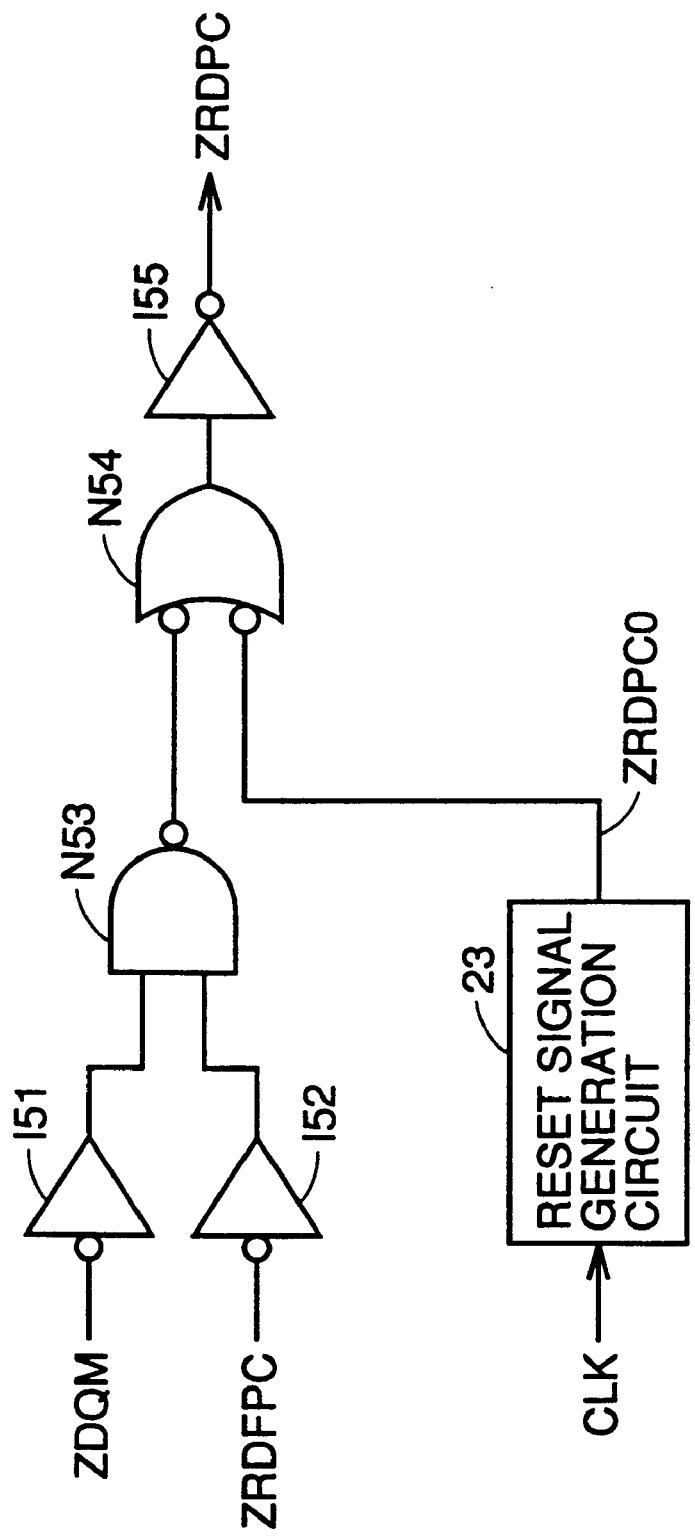
FIG. 3 is a circuit diagram showing an exemplary structure of a reset signal generation circuit 50 shown in FIG. 2.
Figure 13:
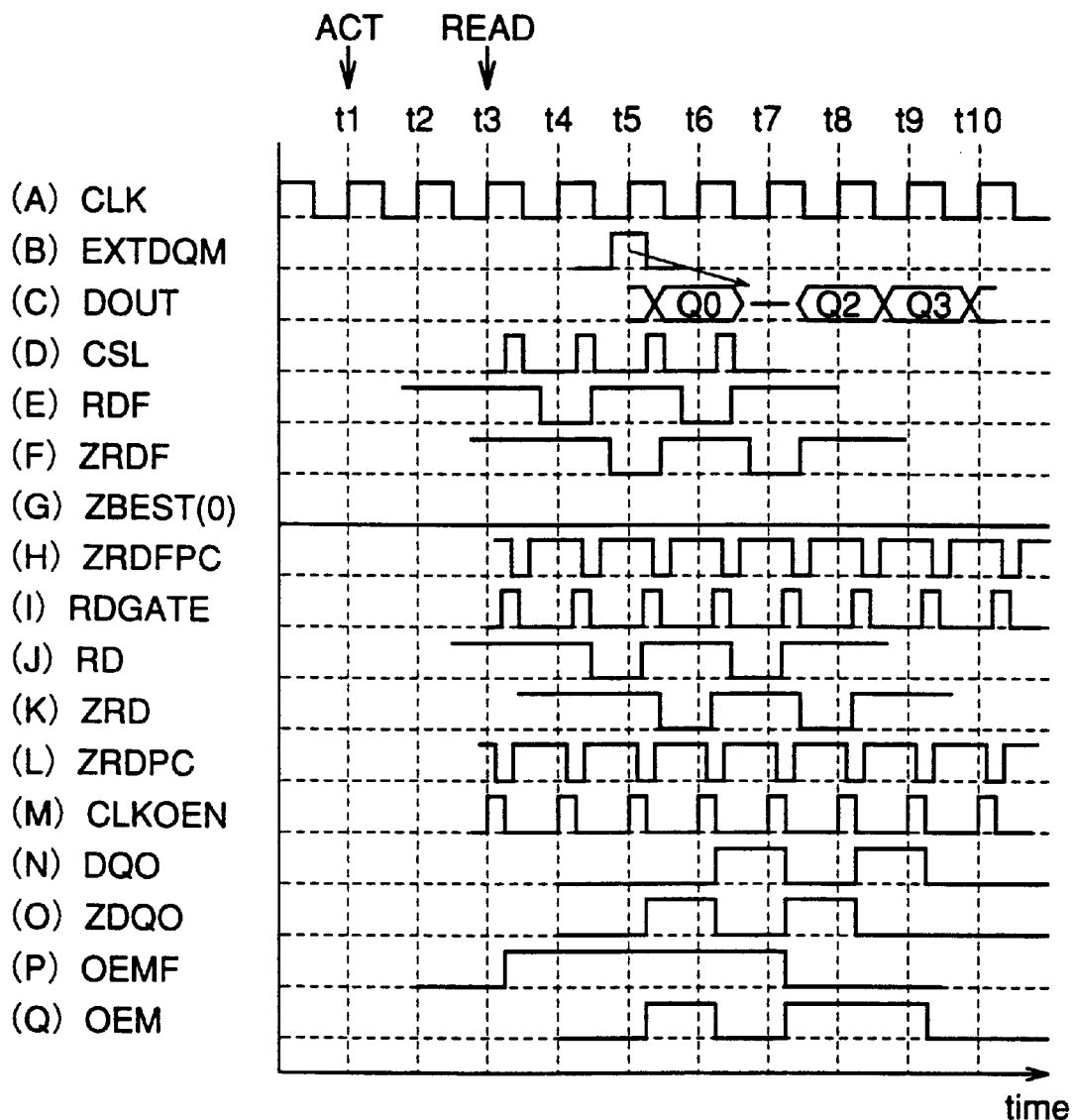
FIG. 13 is a timing chart for illustrating an operation of the conventional synchronous semiconductor memory device 9000.
Figure 14:
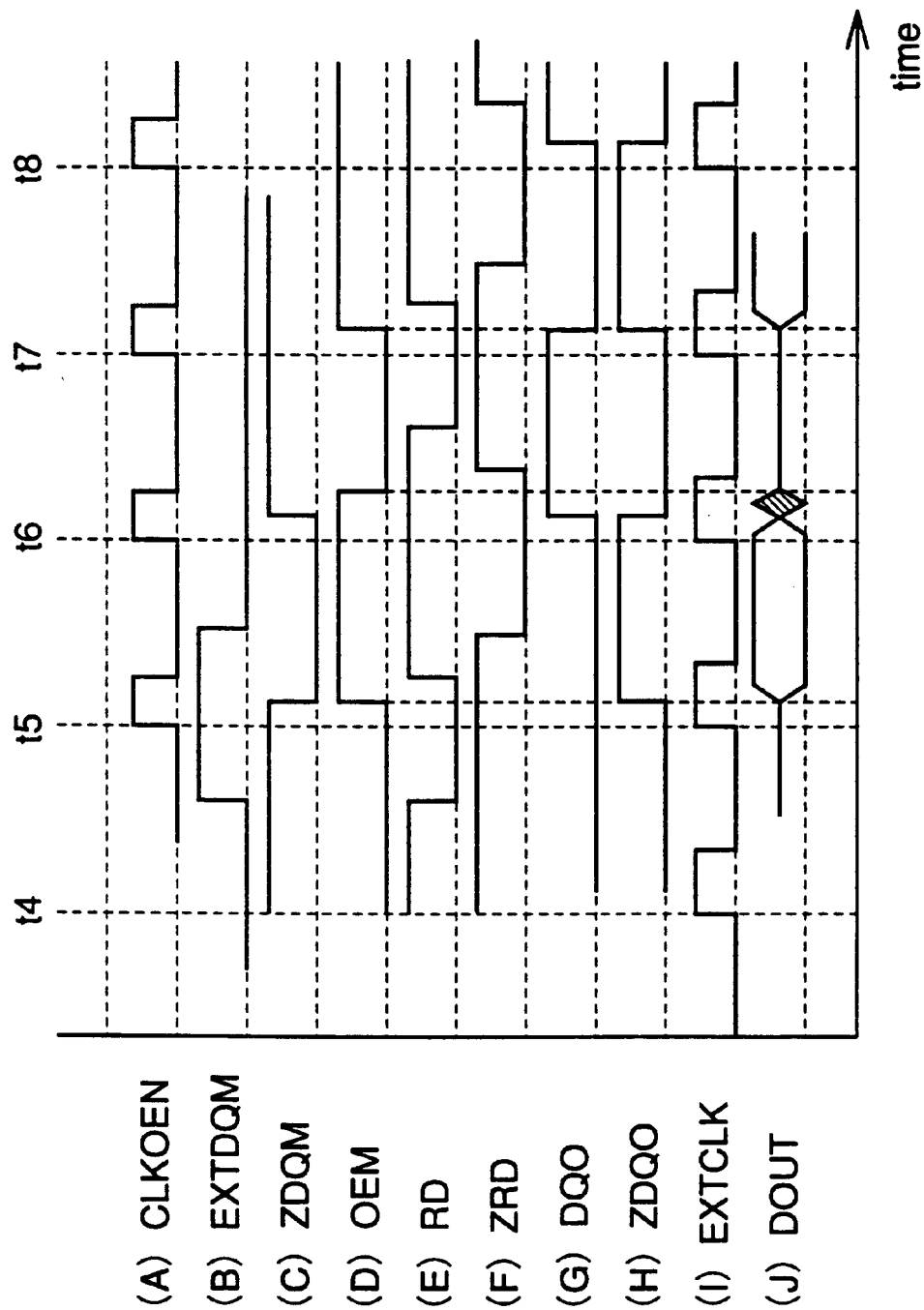
FIG. 14 is a timing chart of illustrating a problem of the conventional synchronous semiconductor memory device 9000.

The reset signal generation circuit 50 shown in FIG. 3 includes a conventional reset signal generation circuit 23, invertor circuits I51, I52 and I55, a NAND circuit N53 and a logic gate N54. For the purpose of simplification, an output of the conventional reset signal generation circuit 23 is referred to as a reset signal ZRDPC0. The reset signal ZRDPC0 rises at the timing shown at (L) in FIG. 13.

When the internal control signal ZDQM is at a low level (the read mask instruction is received), the reset signal generation circuit 50 ANDs the internal control signal ZDQM and a reset signal ZRDFPC for controlling the potential levels of complementary data buses RDF and ZRDF, and outputs the result as a reset signal ZRDPC.

When the internal control signal ZDQM is at a high level, on the other hand, the reset signal generation circuit 50 outputs the reset signal ZRDPC0 as the reset signal ZRDPC. Namely, the reset signal generation circuit 50 generates the reset signal ZRDPC at the same timing as that in the prior art.

An operation of the semiconductor memory device 1000 according to the embodiment 1 of the present invention is now described with reference to a timing chart shown in FIG. 4.

Figure 4:
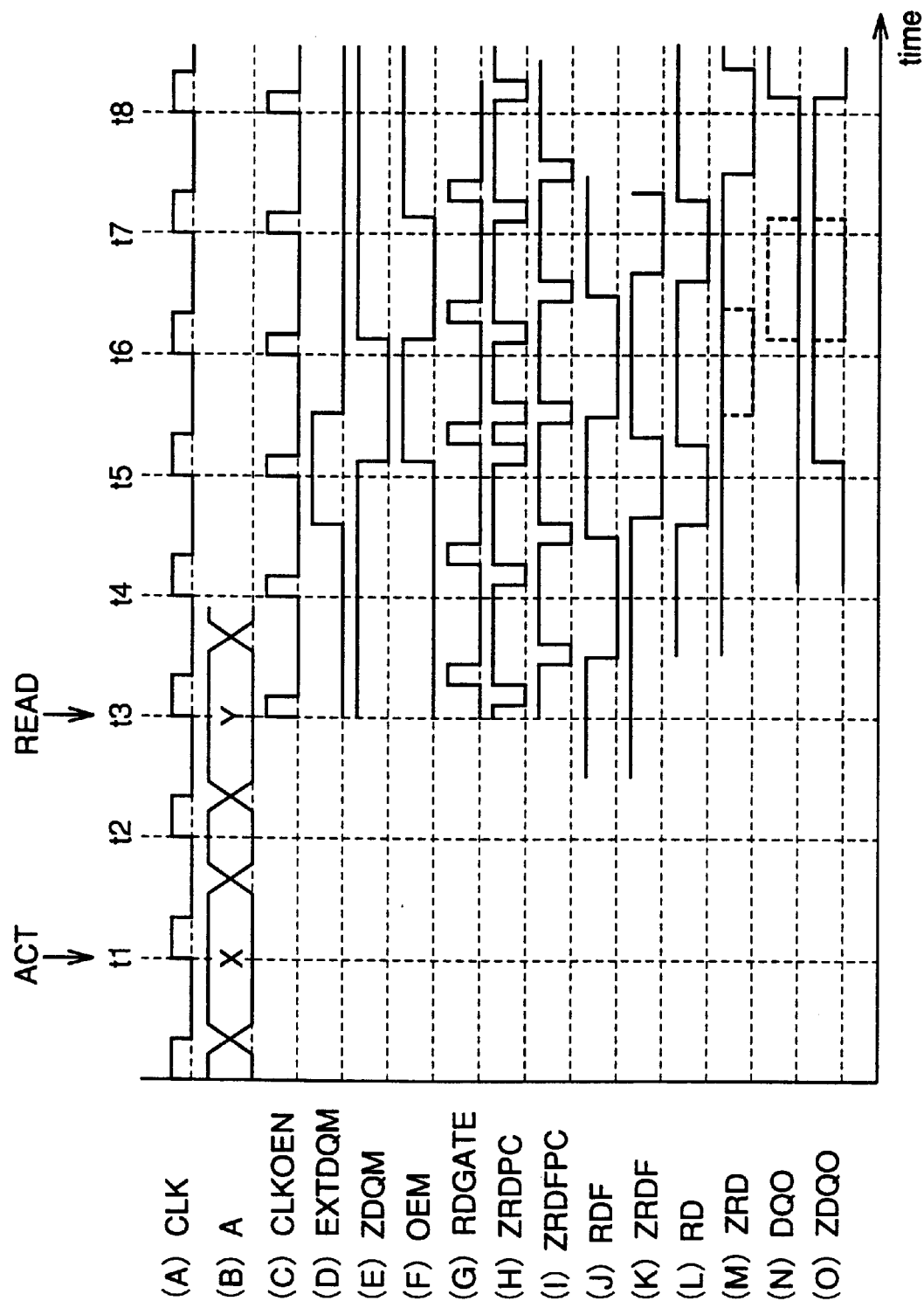
FIG. 4 is a timing chart for illustrating an operation of the synchronous semiconductor memory device 1000 according to the embodiment 1 of the present invention.

Referring to FIG. 4, the semiconductor memory device 1000 starts a read operation at a time t3, for reading data from the memory cell M of the corresponding bank B0 at times t3, t4, t5, . . . . It is assumed that a read mask signal EXTDQM is inputted at the time t5 for masking the data to be outputted to the exterior at a time t7.

When an activation instruction ACT (instruction for activating the word line WL) is inputted for the bank B0 at a time t1 as shown in FIG. 4, the word line WL of the bank B0 corresponding to the row address signal X is activated so that the sense amplifier senses the data of the memory cell M.

The read instruction READ is inputted for the bank B0 at the time t3, whereby a column system of the bank B0 is activated. Thus, the sense amplifier transfers the data of the memory cell M corresponding to the column address signal Y to a preamplifier 11, which in turn amplifies the data. Further, a gate control signal ZBEST(0) goes low at a proper time. Thus, the first data (the data read at the time t3) amplified by the preamplifier 11 is transferred to the complementary data buses RDF and ZRDF.

A gate control signal RDGATE goes high at the time t4, whereby the data is transferred from the complementary data buses RDF and ZRDF to complementary data buses RD and ZRD. Then, the reset control signal ZRDFPC goes low, thereby resetting the complementary data buses RDF and ZRDF.

A gate control signal CLKOEN goes high at the time t5, whereby a final output stage C3 fetches the data of the complementary data buses RD and ZRD. The first read data fetched in the final output stage C3 is outputted from a data input/output terminal DQ to the exterior when the output enable signal OEM goes high.

Then, the reset signal ZRDPC goes low, thereby resetting the complementary data buses RD and ZRD. Then, the gate control signal RDGATE goes high, whereby second read data (invalid data read at the time t4) is transferred from the complementary data buses RDF and ZRDF to the complementary data buses RD and ZRD.

After complete data transfer from the complementary data buses RDF and ZRDF to the complementary data buses RD and ZRD, the reset control signal generation circuit 50 further generates the reset signal ZRDPC, thereby resetting the complementary data buses RD and ZRD. Thus, the invalid data, which ought to be on the data buses RD and ZRD, disappears.

Consequently, the gate control signal CLKOEN opens a gate circuit 15 at a time t6, while the final output stage C3 fetches no invalid data.

In this case, the final output stage C3 holds the second read data. Even if the output enable signal OEM is at a high level at this point of time, therefore, the second read data is outputted and no invalid data is outputted to the exterior. The subsequent operation is performed at the same timing as that in the prior art.

Namely, the output control circuit 100 resets the invalid data (the complementary data buses RD and ZRD) after the same is transferred from the complementary data buses RDF and ZRDF to the complementary data buses RD and ZRD and before the final output stage C3 fetches the data from the complementary data buses RD and ZRD when the internal control signal ZDQM is at a low level.

Thus, the synchronous semiconductor memory device 1000 can prevent external output of invalid data even if the output enable signal OEM is at a high level and goes low in a delay. Consequently, a correct high-speed operation is guaranteed.

While the reset control signal ZRDFPC for controlling an ON/OFF state of a transistor P1 is employed in order to reset the invalid data on the complementary data buses RD and ZRD in the above description, any signal can attain this object so far as the same resets the complementary data buses RD and ZRD after the data transfer from the complementary data buses RDF and ZRDF to the complementary data buses RD and ZRD is completed and before the final output stage C3 starts fetching the data from the complementary data buses RD and ZRD.

Embodiment 2

A synchronous semiconductor memory device according to an embodiment 2 of the present invention is now described. The synchronous semiconductor memory device according to the embodiment 2 of the present invention enables prevention of output of invalid data by controlling data transfer when receiving a read mask instruction.

The synchronous semiconductor memory device according to the embodiment 2 comprises an output control circuit 200 in place of the output control circuit 100 of the synchronous semiconductor memory device 1000 shown in FIGS. 1 and 2.

The output control circuit 200 in the embodiment 2 of the present invention is now described with reference to FIG. 5.

In the following description, elements identical to those of the conventional synchronous semiconductor memory device 9000 are denoted by the same reference numerals or symbols, to omit redundant description.

Figure 5:
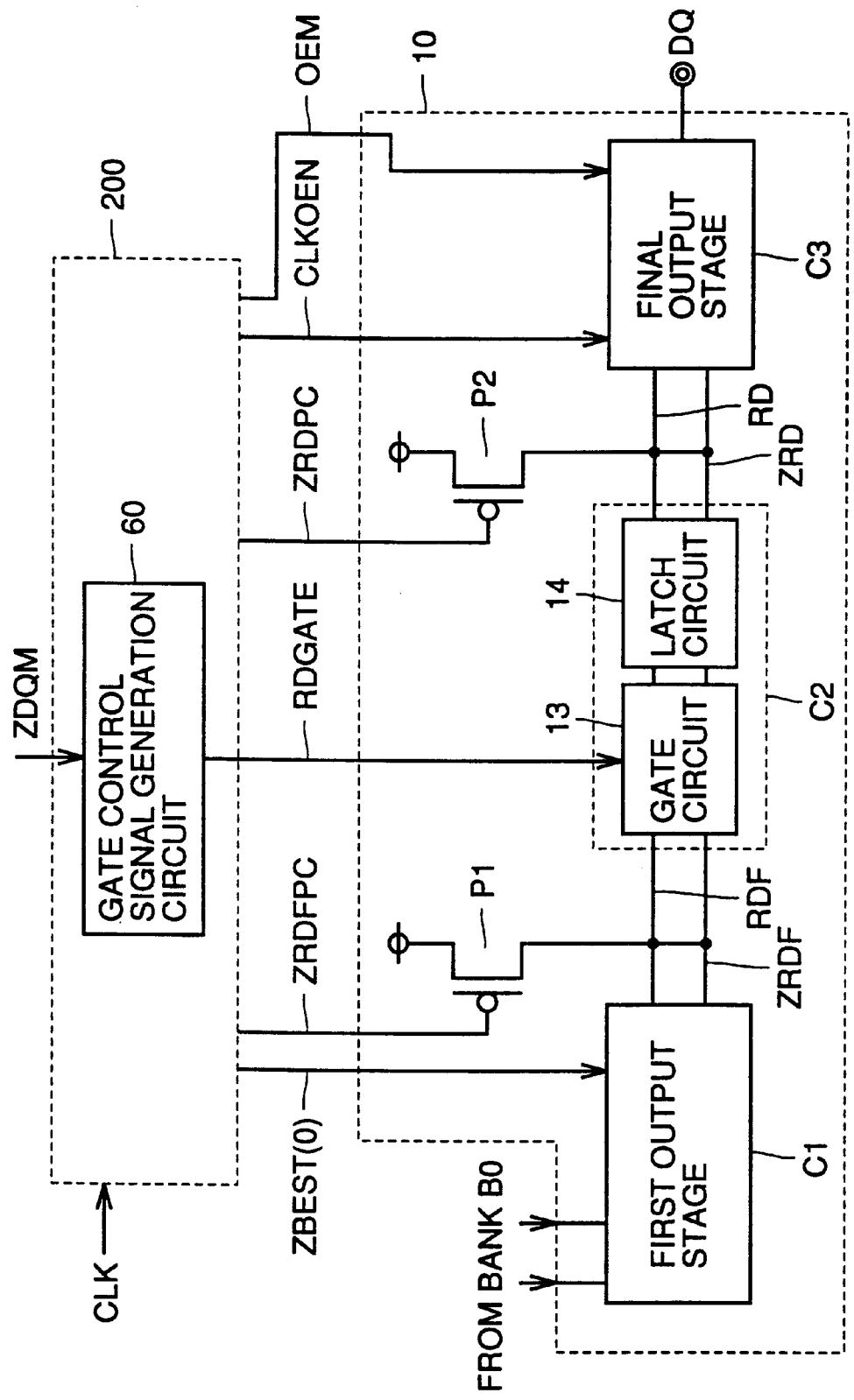
FIG. 5 is a block diagram showing an exemplary structure of a principal part of an output control circuit 200 of a synchronous semiconductor memory device according to an embodiment 2 of the present invention.

The output control circuit 200 shown in FIG. 5 includes a gate control signal generation circuit 60. The gate control signal generation circuit 60 generates and outputs a gate control signal RDGATE for controlling switching of a gate circuit 13 on the basis of an internal clock signal CLK and an internal control signal ZDQM. In more concrete terms, the gate control circuit 60 resets the gate control signal RDGATE generated at prescribed timing in response to a read mask signal EXTDQM, dissimilarly to the conventional gate control signal generation circuit 22. The remaining signals are generated at the same timing as that in the prior art.

Figure 6:
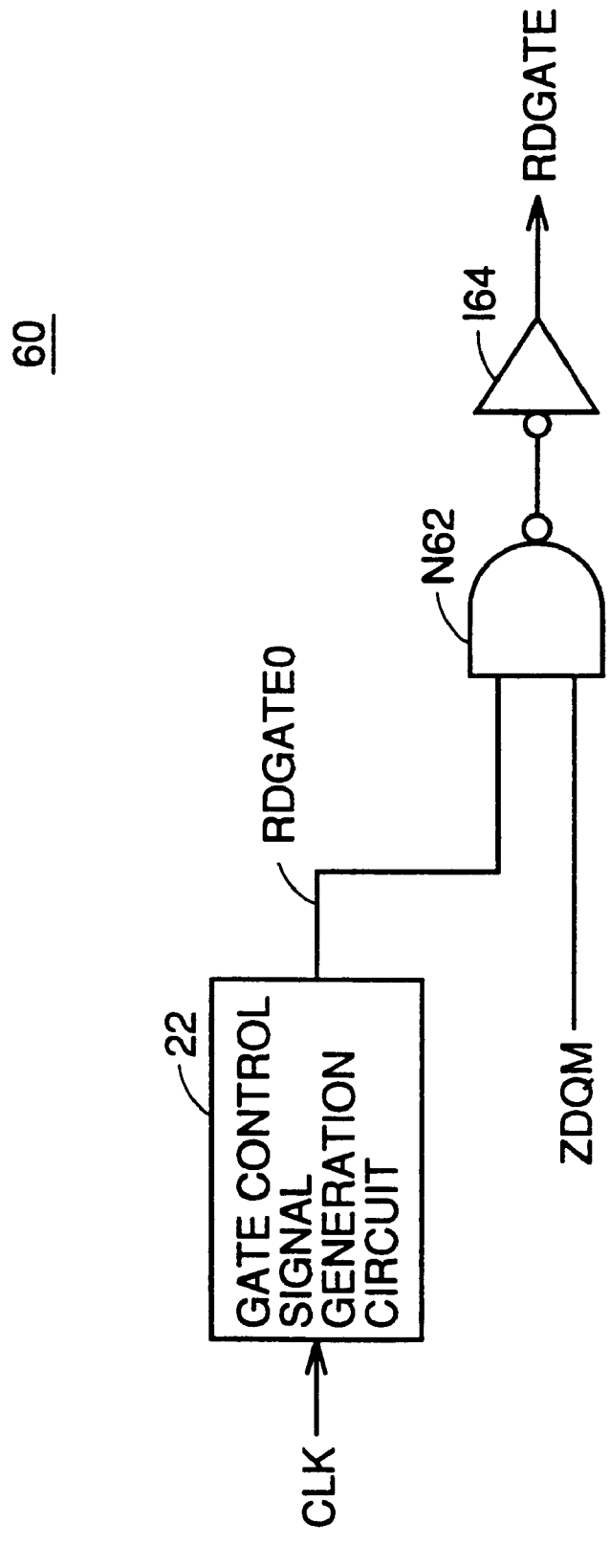
FIG. 6 is a circuit diagram showing an exemplary structure of a gate control signal generation circuit 60 shown in FIG. 5.

An exemplary structure of the gate control signal generation circuit 60 shown in FIG. 5 is now described with reference to FIG. 6.

The gate control signal generation circuit 60 includes a conventional gate control signal generation circuit 22, a NAND circuit N62 and an invertor circuit I64. For the purpose of simplification, an output of the conventional gate control signal generation circuit 22 is referred to as a gate control signal RDGATE0. The gate control signal RDGATE0 rises at the timing shown at (I) in FIG. 13.

When the internal control signal ZDQM is at a low level (the read mask instruction is received), the gate control signal generation circuit 60 resets the gate control signal RDGATE to be generated in general (inhibits transfer).

When the internal control signal ZDQM is at a high level, on the other hand, the gate control signal generation circuit 60 outputs the gate control signal RDGATE0 as the gate control signal RDGATE. Namely, the gate control signal generation circuit 60 generates the gate control signal RDGATE at the same timing as that in the prior art.

An operation of the synchronous semiconductor memory device according to the embodiment 2 of the present invention is now described with reference to a timing chart shown in FIG. 7.

The synchronous semiconductor memory device starts a read operation at a time t3, for reading data from a corresponding memory cell at times t3, t4, t5, . . . . It is assumed that the read mask signal EXTDQM is inputted at the time t5 for masking data to be outputted to the exterior at a time t7. It is also assumed that first read data read from the memory cell at the time t3 is transferred to complementary data buses RD and ZRD at the time t4, as described with reference to FIG. 4.

Figure 7:
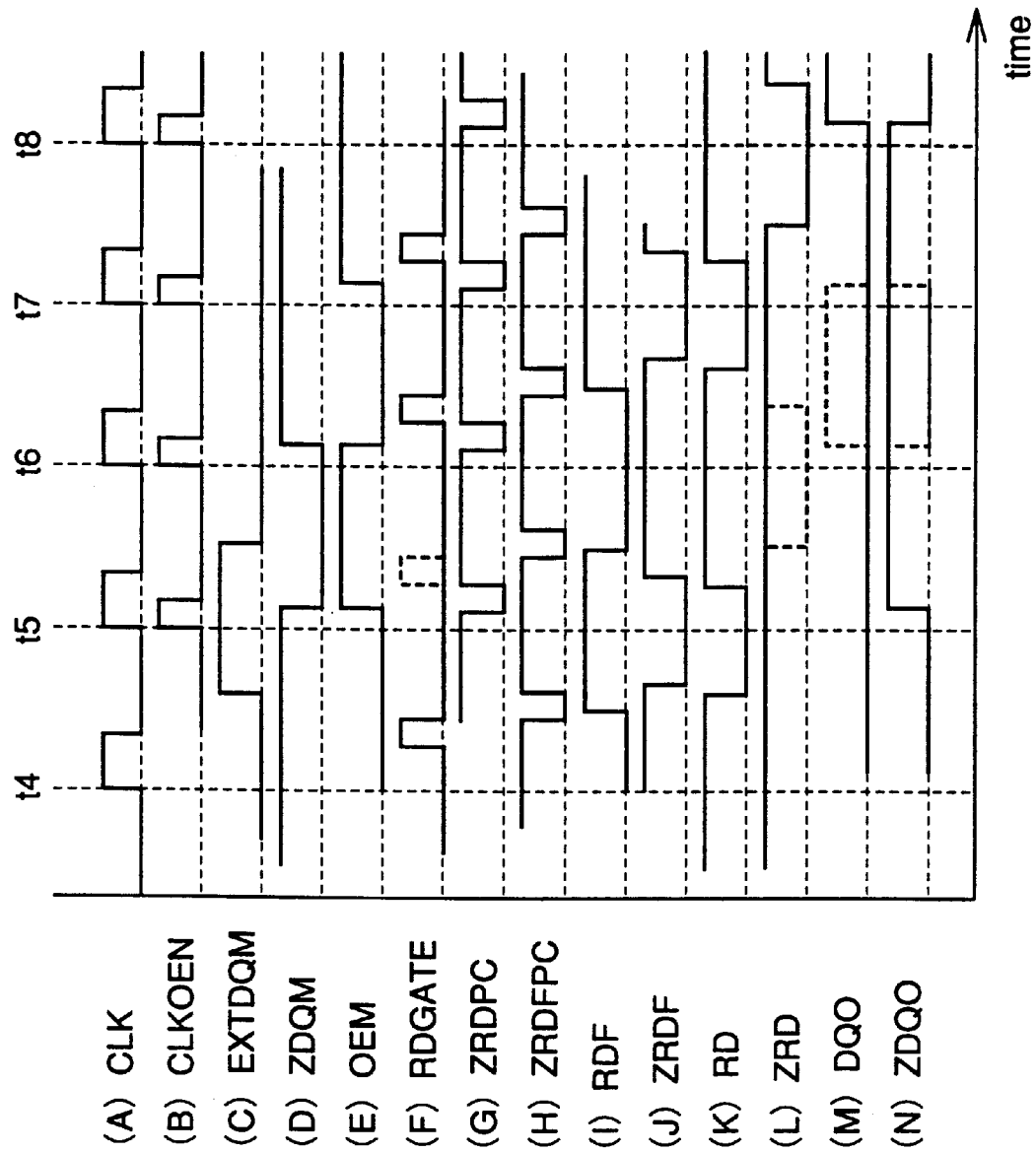
FIG. 7 is a timing chart for illustrating an operation of the synchronous semiconductor memory device according to the embodiment 2 of the present invention.

A gate control signal CLKOEN goes high at the time t5, as shown at (B) in FIG. 7. Thus, a final output stage C3 fetches the data from the complementary data buses RD and ZRD. Consequently, the first read data is outputted from a data input/output terminal DQ to the exterior.

Then, a reset signal ZRDFPC goes low for resetting the complementary data buses RD and ZRD. In general, further, a gate control signal RDGATE goes high so that second read data (invalid data read at the time t4) is transferred from complementary data buses RDF and ZRDF to the complementary data buses RD and ZRD.

However, the gate control signal generation circuit 60 resets the gate control signal RDGATE, thereby inhibiting the data transfer from the complementary data buses RDF and ZRDF to the complementary data buses RD and ZRD.

Then, a reset signal ZRDFPC goes low thereby resetting the complementary data buses RDF and ZRDF.

The complementary data buses RD and ZRD hold the reset states at the time t6. Thus, the gate control signal CLKOEN goes high at the time t6, while the final output stage C3 holds the first read data. Therefore, no invalid data is outputted to the exterior even if an output enable signal OEN is at a high level. The subsequent operation is performed in the same timing as that in the prior art.

Namely, when the internal control signal ZDQM at a low level, the output control circuit 200 inhibits transfer of the data (invalid data) from the complementary data buses RDF and ZRDF to the complementary data buses RD and ZRD after the data is transferred from the complementary data buses RD and ZRD to the final output stage C3 and the invalid data is reset (the complementary data buses RD and ZRD are reset).

Thus, the synchronous semiconductor memory device according to the embodiment 2 of the present invention can prevent external output of invalid data even if the output enable signal OEM is at a high level and converted to a low level in a delay, due to the provision of the output control circuit 200. Consequently, a correct high-speed operation is guaranteed.

While the above description has been made with reference to complementary data buses capable of implementing standby states (reset states), even single data buses incapable of entering reset states (i.e., standby states) can attain a similar effect as described below: When the output control circuit 200 is so structured as to stop opening of the gate circuit 13 of the second output stage C2 for inhibiting the data transfer from the data bus RDF (single) to the data bus RD (single) at the time t5, the data bus RD preserves the data (read at the time t3) transferred to the final output stage C3 at the time t5 as such. Even if the final output stage 3 fetches the data from the data bus RD in response to the gate control signal CLKOEN at the time t6, therefore, no invalid data is outputted to the exterior.

Embodiment 3

A synchronous semiconductor memory device according to an embodiment 3 of the present invention is now described. The synchronous semiconductor memory device according to the present invention enables prevention of external output of invalid data by controlling switching of a gate in a final output stage when receiving a read mask instruction.

The synchronous semiconductor memory device according to the embodiment 3 of the present invention comprises an output control circuit 300, in place of the output control circuit 100 of the synchronous semiconductor memory device 1000 shown in FIGS. 1 and 2.

The output control circuit 300 according to the embodiment 3 of the present invention is now described with reference to FIG. 8.

In the following description, elements identical to those of the conventional synchronous semiconductor memory device 9000 are denoted by the same reference numerals or symbols, to omit redundant description.

Figure 8:
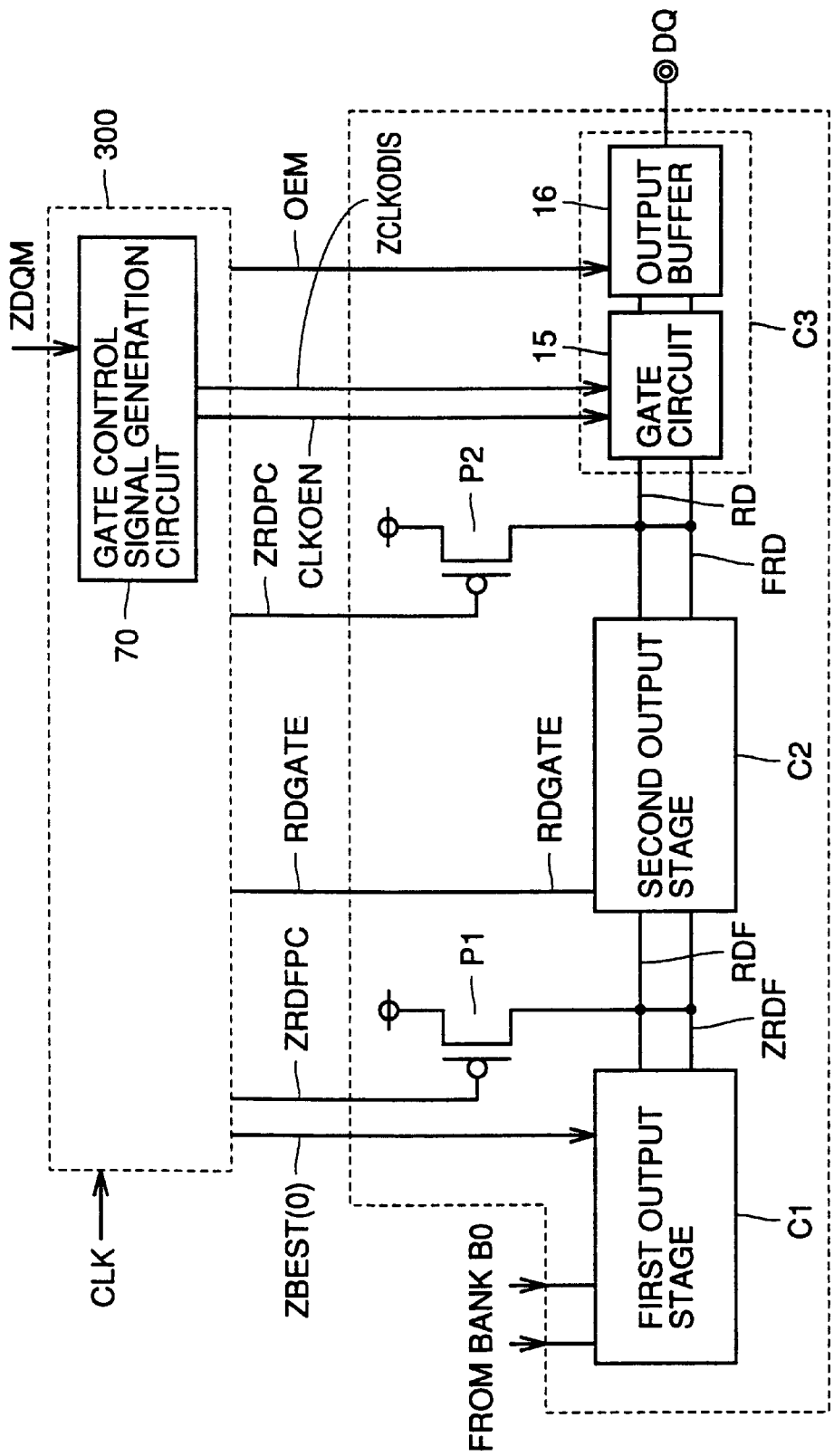
FIG. 8 is a block diagram showing an exemplary structure of a principal part of an output control circuit 300 of a synchronous semiconductor memory device according to an embodiment 3 of the present invention.

The output control circuit 300 shown in FIG. 8 includes a gate control signal generation circuit 70. The gate control signal generation circuit 70 generates and outputs gate control signals CLKOEN and ZCLKODIS for controlling switching of a gate circuit 15 on the basis of an internal clock signal CLK and an internal control signal ZDQM. The output control circuit 300 generates the remaining signals at the same timing as that in the prior art.

An exemplary structure of the gate control signal generation circuit 70 shown in FIG. 8 is now described with reference to FIG. 9.

Figure 9:
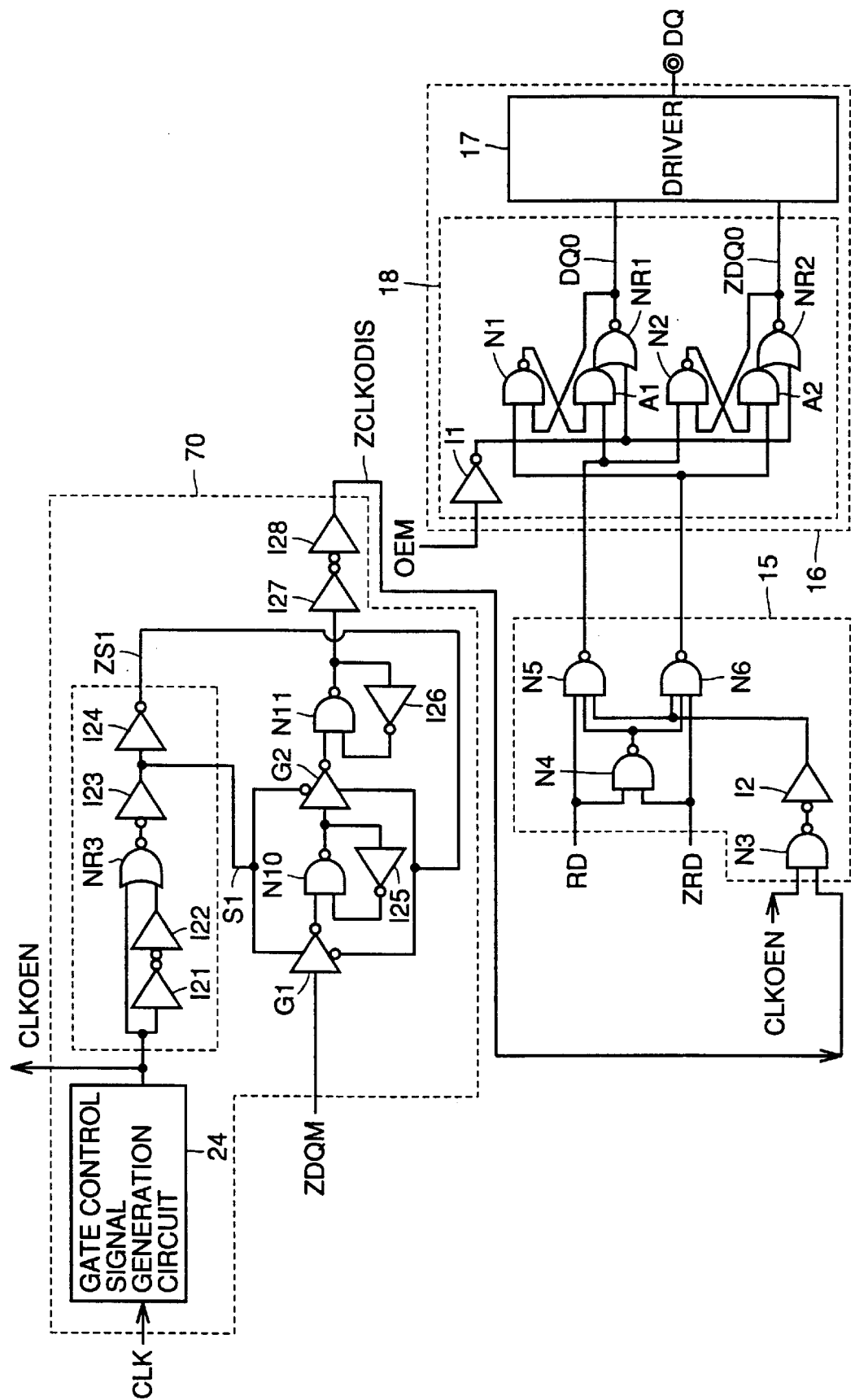
FIG. 9 is a circuit diagram showing an exemplary structure of a gate control signal generation circuit 70 shown in FIG. 8.

The gate control generation circuit 70 shown in FIG. 9 comprises invertor circuits I21, I22, I23 and I24, a NOR circuit NR3 and a conventional gate control signal generation circuit 24.

The invertor circuits I21, I22, I23 and I24 and the NOR circuit NR3 receive an output signal (CLKOEN) from the conventional gate control signal generation circuit 24, for spreading its H width and outputting the result. The gate control signal CLKOEN rises at a time identical to that described with reference to FIG. 13. Output signals of the invertor circuits I23 and I24 are referred to as a signal S1 and a signal ZS1 (inverted signal) respectively.

The gate control signal generation circuit 70 further comprises a shifter formed by gate circuits G1 and G2, NAND circuits N10 and N11 and invertor circuits I25 and I26. The gate circuit G1 inverts the internal control signal ZDQM and outputs the result to the NAND circuit N10 in response to the signals S1 and ZS1. The NAND circuit N10 and the invertor circuit I25 form a latch circuit. The gate circuit G2 inverts an output signal of the NAND circuit N10 and outputs the result to the NAND circuit N11 in response to the signals S1 and ZS1. The NAND circuit N11 and the invertor circuit I26 form a latch circuit.

The gate circuit G1, the NAND circuit N10 and the invertor circuit I25 shift the internal control signal ZDQM by a half clock. Further, the gate circuit G2, the NAND circuit N11 and the invertor circuit I26 shift this signal further by a half clock.

The gate control signal generation circuit 70 further comprises invertor circuits I27 and I28. The invertor circuit I27 receives and inverts an output signal of the NAND circuit N11. The invertor circuit I28 receives and inverts an output of the invertor circuit I27 and outputs the inverted signal (the gate control signal ZCLKODIS).

The gate control signal generation circuit 70 outputs the gate control signals ZCLKODIS and CLKOEN to a final output stage C3.

A NAND circuit N3 of the final output stage C3 receives the gate control signals ZCLKODIS and CLKOEN in first and second input nodes thereof respectively.

When the internal control signal ZDQM is at a low level (receiving a read mask instruction), the gate control signal generation circuit 70 outputs the gate control signal ZCLKODIS of a low level. In this case, the gate circuit 15 mains in a closed state regardless of the gate control signal CLKOEN, so that the final output stage C3 fetches no data from complementary data buses RD and ZRD.

When the internal control signal ZDQM is at a high level, on the other hand, the gate control signal ZCLKODIS holds a high level. In this case, the gate circuit 15 is switched in accordance with the gate control signal CLKOEN at the same timing as that in the prior art.

An operation of the synchronous semiconductor memory device according to the embodiment 3 of the present invention is now described with reference to a timing chart shown in FIG. 10.

The synchronous semiconductor memory device starts a read operation at a time t3, for reading data from a corresponding memory cell at times t3, t4, t5 . . . . A read mask signal EXTDQM is inputted at the time t5, for masking data to be outputted to the exterior at a time t7. It is assumed that read data first read from the memory cell at the time t3 is transferred to the complementary data buses RD and ZRD at the time t4, as described with reference to FIG. 4.

Figure 10:
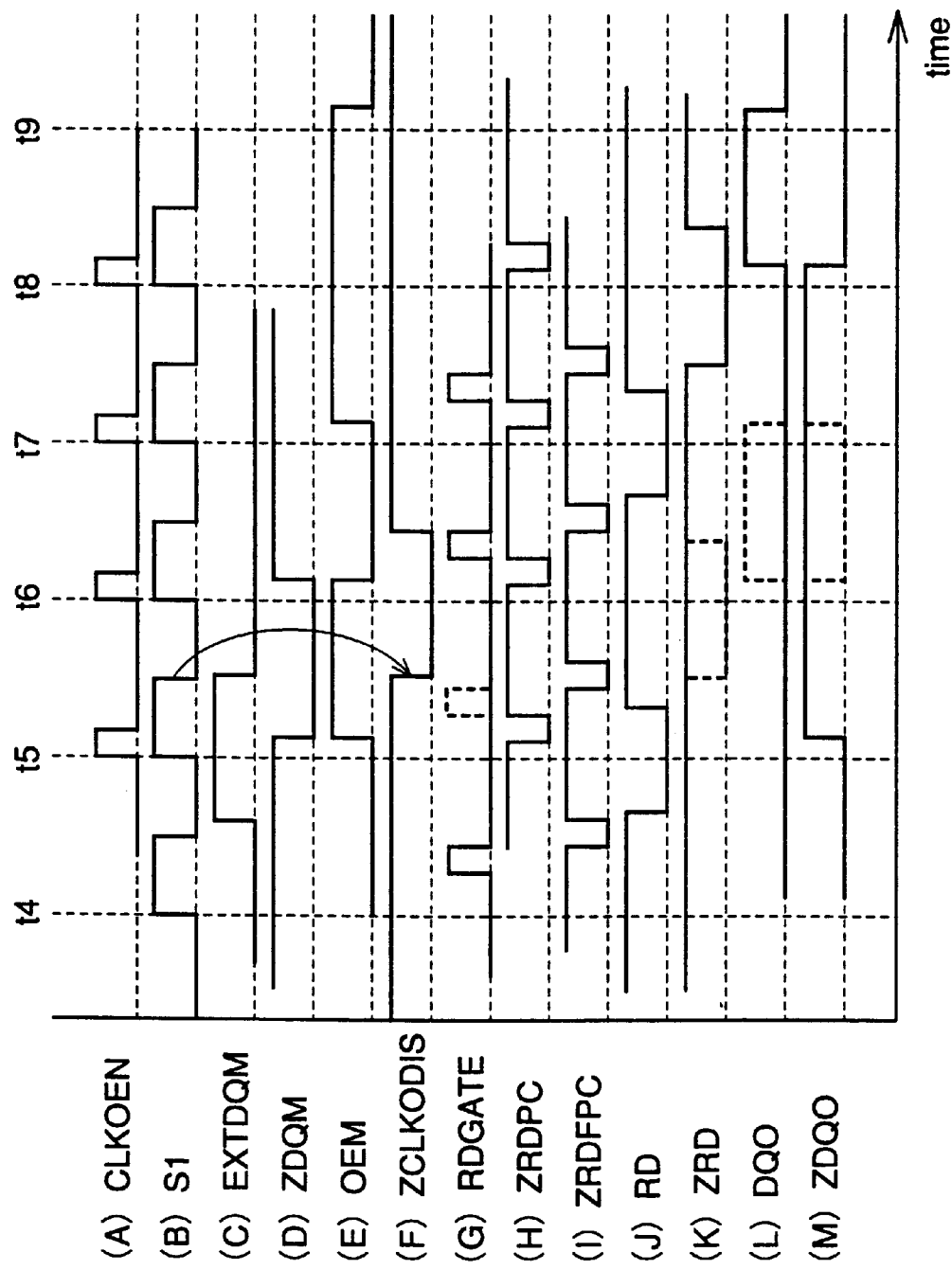
FIG. 10 is a timing chart for illustrating an operation of the synchronous semiconductor memory device according to the embodiment 3 of the present invention.
Figure 11:
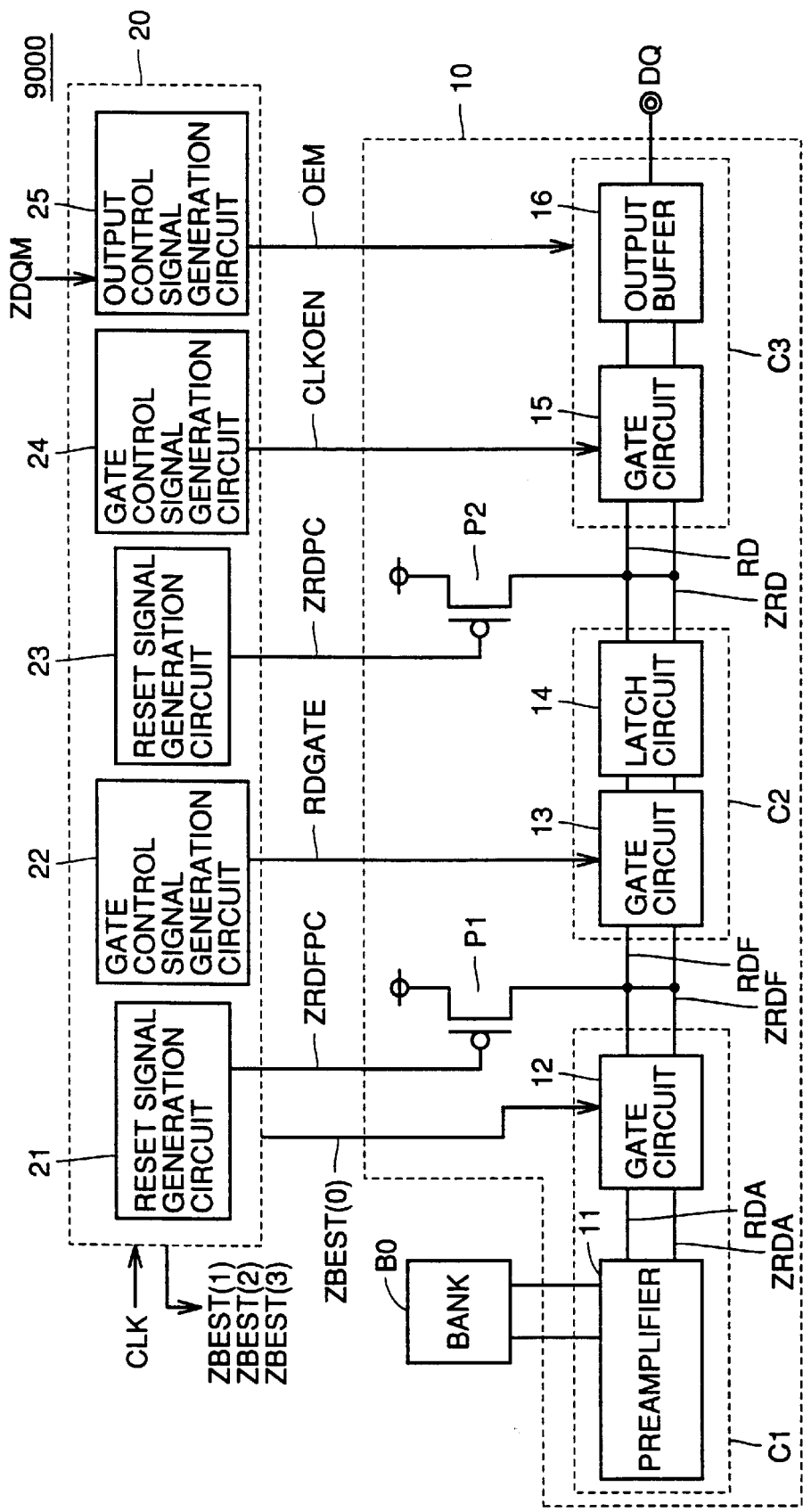
FIG. 11 is a schematic diagram showing the structure of a principal part of a conventional synchronous semiconductor memory device 9000.
Figure 12:
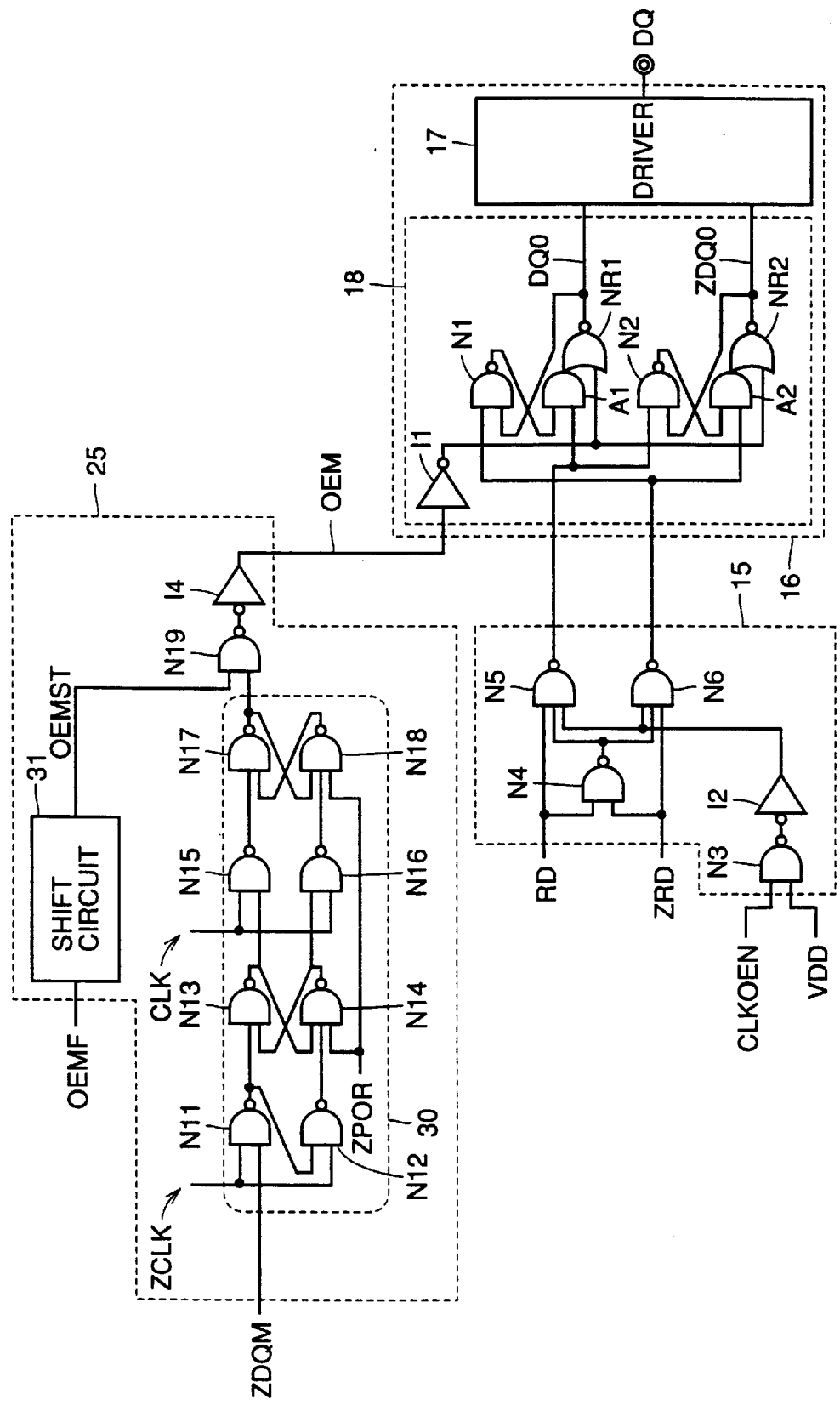
FIG. 12 is a circuit diagram showing the structures of an output control signal generation circuit 25 and a final output stage C3 included in the conventional synchronous semiconductor memory device 9000.

The gate control signal CLKOEN goes high at the time t5 as shown at (A) in FIG. 10, so that the final output stage C3 fetches the first read data from the complementary data buses RD and ZRD.

A gate control signal RDGATE goes high, for transferring second read data (invalid data read at the time t4) from complementary data buses RDF and ZRDF to the complementary data buses RD and ZRD.

The gate control signal generation circuit 70 generates the gate control signal CLKOEN as well as signals S1 and ZS1 having a larger H width than the gate control signal CLKOEN. The gate control signal generation circuit 70 shifts the fetched internal control signal ZDQM by one clock and outputs the same in response to the signals S1 and ZS1. Thus, the gate control signal generation circuit 70 generates the gate control signal ZCLKODIS of a low level.

Consequently, the gate control signal CLKOEN goes high at a time t6, while the gate circuit 15 remains in a closed state so that the final output stage C3 fetches no invalid data.

In this case, the output final stage C3 holds the first read data. Even if the output enable signal OEM goes high, therefore, no invalid data is outputted to the exterior.

Namely, when the internal control signal ZDQM is at a low level, the output control circuit 300 maintains the gate circuit 15 in the closed state so that the final output stage C3 fetches no invalid data from the complementary data buses RD and ZRD.

Thus, the synchronous semiconductor memory device according to the embodiment 3 of the present invention can prevent external output of invalid data even if the output enable signal OEM is at a high level and converted to a low level in a delay, due to the provision of the output control circuit 300. Consequently, a correct high-speed operation is guaranteed.

While the above description has been made with reference to complementary buses, the embodiment 3 of the present invention is also applicable to single data buses, which can implement a standby state if capable of transmitting at least ternary data.

Information as to effectiveness of transmitted data may be transmitted to a receiver through another signal line in case of employing single data buses, a standby state corresponds to transmission of information as to invalidness of the transmitted data to the receiver in this case.

According to the present invention, as hereinabove described, the synchronous semiconductor memory device can reset the data buses for transferring data to the final stage output circuit when invalid data is transferred to the data buses in response to the read mask signal.

Further, the synchronous semiconductor memory device can reset the data buses after the data are transferred between the data buses at prescribed timing and before the final stage output circuit fetches invalid data from the data buses in case of transferring data through a plurality of data buses.

Namely, the synchronous semiconductor memory device resets the data buses provided with the invalid data in response to the read mask signal, thereby preventing external output of the invalid data. Thus, the synchronous semiconductor memory device guarantees a correct high-speed operation while ensuring a data holding period for output data. Thus, a malfunction can be prevented in the overall system including the synchronous semiconductor memory device.

Further, the synchronous semiconductor memory device according to the present invention can inhibit transfer of invalid data to the data buses after resetting the data buses in response to the read mask signal.

In addition, the synchronous semiconductor memory device inhibits transfer of the invalid data to the data buses after the data buses transferring the data to the final stage output circuit are reset and before the final stage output circuit fetches the data.

Further, the synchronous semiconductor memory device inhibits transfer of the invalid data to the data buses for transferring data from the preceding data buses to the final stage output circuit in case of transferring data through a plurality of data buses.

Further, the synchronous semiconductor memory device inhibits transfer of the invalid data to the data buses after the data buses for transferring data to the final stage output circuit are reset and before the final stage output circuit fetches the data in case of transferring data through a plurality of data buses.

Namely, the synchronous semiconductor memory device can inhibit data transfer between the read circuit and the data buses in response to the read mask signal, thereby preventing external output of invalid data. Thus, the synchronous semiconductor memory device guarantees a correct high-speed operation while ensuring a data holding period for output data. Thus, a malfunction can be prevented in the overall system including the synchronous semiconductor memory device.

Further, the synchronous semiconductor memory device according to the present invention can inhibit the transfer (switch) timing for the gate circuit provided on the final stage output circuit in response to the read mask signal.

Further, the synchronous semiconductor memory device can reset the data buses after inhibiting the transfer (switch) timing for the gate circuit provided on the final stage output circuit.

Namely, the synchronous semiconductor memory device can inhibit the final output stage from fetching data in response to the read mask signal, thereby preventing external output of invalid data. Thus, the synchronous semiconductor memory device guarantees a correct high-speed operation while ensuring a data holding period for output data. Thus, a malfunction can be prevented in the overall system including the synchronous semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:
   a plurality of banks each including a memory cell array including a plurality of memory cells being arranged in rows and columns and a plurality of word lines being provided in correspondence to said rows of said memory cell array respectively;
   an internal clock generation circuit for outputting an internal clock signal being synchronized with an external clock signal;
   a read circuit for reading data from any said memory cell of corresponding said bank in synchronization with said internal clock signal in response to a read instruction being inputted from the exterior;
   a data bus for transferring said data being read by said read circuit;
   an output circuit for receiving said data being transferred from said data bus and outputting a signal corresponding to said data to a data output terminal;
   a reset circuit for resetting said data bus; and
   an output control circuit for controlling timing for resetting said data bus by said reset circuit,
   said output control circuit bringing said data bus into a reset state in response to a mask signal for inhibiting external output of said data being outputted from said read circuit at prescribed timing.

2. The synchronous semiconductor memory device in accordance with claim 1, wherein
   said output control circuit brings said data bus into a reset state in response to said mask signal after making said data bus transfer said data from said read circuit.

3. The synchronous semiconductor memory device in accordance with claim 1, wherein
   said output circuit includes a gate circuit for fetching said data being transferred from said data bus at prescribed timing, and said output control circuit brings said data bus into a reset state in response to said mask signal after making said data bus transfer said data from said read circuit and before making said gate circuit fetch said data in said output circuit.

4. The synchronous semiconductor memory device in accordance with claim 1, wherein
   said data bus includes:
   a first data bus for transferring said data being read by said read circuit, and
   a second data bus being provided between said first data bus and said output circuit,
   said synchronous semiconductor memory device further comprises a first gate circuit for receiving said data being transferred by said first data bus and transferring said data to said second data bus at prescribed timing, and
   said output control circuit brings said second data bus into a reset state in response to said mask signal after making said first gate circuit transfer said data from said first data bus to said second data bus.

5. The synchronous semiconductor memory device in accordance with claim 4, wherein
   said output circuit includes a second gate circuit for fetching said data being transferred from said second data bus at prescribed timing, and
   said output control circuit brings said second data bus into a reset state after making said first gate circuit transfer said data from said first data bus to said second data bus and before making said second gate circuit fetch said data being transferred from said second data bus into said output circuit.

6. A synchronous semiconductor memory device comprising:
   a plurality of banks each including a memory cell array including a plurality of memory cells being arranged in rows and columns and a plurality of word lines being provided in correspondence to said rows of said memory cell array respectively;
   an internal clock generation circuit for outputting an internal clock signal being synchronized with an external clock signal;
   a read circuit for reading data from any said memory cell of corresponding said bank in synchronization with said internal clock signal in response to a read instruction being inputted from the exterior;
   a data bus for transferring said data being read by said read circuit;
   an output circuit for receiving said data being transferred from said data bus and outputting a signal corresponding to said data to a data output terminal; and
   an output control circuit for controlling transfer of said data from said read circuit to said data bus,
   said output control circuit inhibiting said transfer of said data from said read circuit to said data bus in response to a mask signal for inhibiting external output of said data being outputted from said read circuit at prescribed timing.

7. The synchronous semiconductor memory device in accordance with claim 6, further comprising a reset circuit for resetting said data bus at prescribed timing,
   said output control circuit inhibiting said transfer of said data from said read circuit to said data bus in response to said mask signal after bringing said data bus into a reset state.

8. The synchronous semiconductor memory device in accordance with claim 7, wherein said output circuit includes a gate circuit for fetching said data being transferred from said data bus at prescribed timing, and said output control circuit inhibits said transfer of said data from said read circuit to said data bus in response to said mask signal after bringing said data bus into a reset state and before making said gate circuit fetch said data being transferred from said data bus into said output circuit.

9. The synchronous semiconductor memory device in accordance with claim 6, wherein said data bus includes:

a first data bus for transferring said data being read by said read circuit, and a second data bus being provided between said first data bus and said output circuit, said synchronous semiconductor memory device further comprises a first gate circuit for receiving said data being transferred by said first data bus and transferring said data to said second data bus at prescribed timing, and said output control circuit inhibits said first gate circuit from transferring said data from said first data bus to said second data bus in response to said mask signal.

10. The synchronous semiconductor memory device in accordance with claim 9, further comprising a reset circuit for resetting said second data bus at prescribed timing, said output control circuit inhibiting transfer of said data from said first data bus to said second data bus in response to said mask signal after bringing said second data bus into a reset state.

11. The synchronous semiconductor memory device in accordance with claim 10, wherein said output circuit includes a second gate circuit for fetching said data being transferred from said second data bus at prescribed timing, and said output control circuit inhibits said first gate circuit from transferring said data from said first data bus to said second data bus in response to said mask signal after bringing said second data bus into a reset state and before making said second gate circuit fetch said data from said second data bus into said output circuit.

12. A synchronous semiconductor memory device comprising:

a plurality of banks each including a memory cell array including a plurality of memory cells being arranged in rows and columns and a plurality of word lines being provided in correspondence to said rows of said memory cell array respectively;

an internal clock generation circuit for outputting an internal clock signal being synchronized with an external clock signal;

a read circuit for reading data from any said memory cell of corresponding said bank in synchronization with said internal clock signal in response to a read instruction being inputted from the exterior;

a data bus for transferring said data being read by said read circuit;

an output circuit including a gate for fetching said data being transferred from said data bus and a buffer for receiving an output of said gate and outputting a signal corresponding to said data to a data output terminal; and an output control circuit for controlling timing for fetching said data by said gate, said output control circuit inhibiting said gate from fetching said data from said data bus in response to a mask signal for inhibiting external output of said data being outputted from said read circuit at prescribed timing.

13. The synchronous semiconductor memory device in accordance with claim 12, further comprising a reset circuit for resetting said data bus at prescribed timing, said output control circuit bringing said data bus into a reset state after inhibiting said output circuit from fetching said data from said data bus in response to said mask signal.

14. The synchronous semiconductor memory device in accordance with claim 12, wherein said output control circuit includes:

a control circuit for opening/closing said gate at prescribed timing, and a shift circuit for shifting said mask signal and outputting the result, and said gate fetches said data into said output circuit in response to a first control signal being outputted from said control circuit and a second control signal corresponding to said mask signal being outputted from said shift circuit.

* * * * *